United States Patent
Thompson

(10) Patent No.: US 6,914,004 B2
(45) Date of Patent: Jul. 5, 2005

(54) METHOD FOR VIA ETCHING IN ORGANO-SILICA-GLASS

(75) Inventor: Keith J. Thompson, Madison, WI (US)

(73) Assignee: Texas Instruments Incorporated, Dallas, TX (US)

(*) Notice: Subject to any disclaimer, the term of this patent is extended or adjusted under 35 U.S.C. 154(b) by 162 days.

(21) Appl. No.: 10/237,371

(22) Filed: Sep. 9, 2002

(65) Prior Publication Data

US 2003/0064601 A1 Apr. 3, 2003

Related U.S. Application Data

(60) Provisional application No. 60/325,848, filed on Sep. 28, 2001.

(51) Int. Cl.$^7$ .............................................. H01L 21/311
(52) U.S. Cl. ...................... 438/700; 438/706; 438/714; 438/725
(58) Field of Search ................................ 438/700, 706, 438/714, 725

(56) References Cited

U.S. PATENT DOCUMENTS

| | | | | |
|---|---|---|---|---|
| 6,083,844 A | | 7/2000 | Bui-Le et al. | ............... 438/720 |
| 6,143,665 A | | 11/2000 | Hsieh | .......................... 438/710 |
| 6,168,726 B1 | * | 1/2001 | Li et al. | .......................... 26/79 |
| 6,211,063 B1 | | 4/2001 | Liu et al. | ..................... 438/624 |
| 6,362,109 B1 | * | 3/2002 | Kim et al. | .................. 438/706 |
| 6,413,877 B1 | * | 7/2002 | Annapragada | ............. 438/723 |
| 6,455,411 B1 | * | 9/2002 | Jiang et al. | ................. 438/624 |
| 6,475,918 B1 | * | 11/2002 | Izawa et al. | ................ 438/714 |
| 6,620,733 B2 | * | 9/2003 | Ho | ............................. 438/700 |
| 2001/0005634 A1 | | 6/2001 | Kajiwara | ..................... 438/706 |
| 2002/0121500 A1 | * | 9/2002 | Annapragada et al. | ........ 216/67 |
| 2002/0139771 A1 | * | 10/2002 | Jiang et al. | .................... 216/58 |
| 2002/0164877 A1 | | 11/2002 | Catabay et al. | ............. 438/694 |
| 2003/0211750 A1 | | 11/2003 | Kim et al. | .................. 438/711 |
| 2003/0235993 A1 | | 12/2003 | Leung et al. | ................ 438/710 |

FOREIGN PATENT DOCUMENTS

| | | |
|---|---|---|
| EP | 1 059 664 A2 | 12/2000 |
| EP | 1 085 563 A2 | 3/2001 |
| GB | 2 368 457 A | 5/2002 |
| JP | 2001-210627 | 8/2001 |
| JP | 2002-270586 | 9/2002 |

* cited by examiner

*Primary Examiner*—Duy-Vu N. Deo
(74) *Attorney, Agent, or Firm*—Yingsheng Tung; Wade James Brady, III; Frederick J. Telecky, Jr.

(57) ABSTRACT

According to one embodiment of the invention, a method for via etching in a dielectric material includes providing a wafer (200) having a substrate (202), an etch stop layer (210) disposed outwardly from the substrate, an Organo-Silica-Glass layer (212) disposed outwardly from the etch stop layer (210), and a photoresist layer (216) disposed outwardly from the Organo-Silica-Glass layer (212), and positioning the wafer (200) within a process chamber (114). The method further includes introducing a first source gas mixture (110) into the process chamber (114) to etch a first portion of the Organo-Silica-Glass layer (212) utilizing the first source gas mixture (110), and introducing a second source gas mixture (110) into the process chamber (114) to etch, for a predetermined time period, a second portion of the Organo-Silica-Glass layer (212) down to the etch stop layer (210). The second source gas mixture (110) includes a fluorocarbon, a noble gas, carbon monoxide, and nitrogen.

20 Claims, 2 Drawing Sheets

METHOD FOR VIA ETCHING IN ORGANO-SILICA-GLASS

This application claims priority under 35 USC 119(e)(1) of provisional application No. 60/325,848 filed Sep. 28, 2001.

TECHNICAL FIELD OF THE INVENTION

This invention relates generally to the field of semiconductor devices and, more specifically, to a method for via etching in Organo-Silica-Glass ("OSG").

BACKGROUND OF THE INVENTION

Electronic equipment, such as televisions, telephones, radios, and computers, are often constructed using semiconductor components, such as integrated circuits and microprocessors. In an effort to ramp microprocessor speed semiconductor component manufacturers have become increasingly concerned with the RC time delay of interconnects. Some of the most publicized changes involve changes from aluminum to copper interconnects, but this alone does not meet speed requirements. A more effective approach is to simultaneously reduce line resistance and line capacitance. This is accomplished through the introduction of low-k dielectric materials (i.e., dielectric materials having a low dielectric constant and a high resistance) to take the place of high-k silica dielectrics. In addition, the associated etch stop and barrier layers, used to both protect the copper from exposure during processing and to provide an etch stop layer for the via etches, may also be switched from high dielectric to low dielectric materials. For example, the industry has been moving from silicon nitride etch stop layers to silicon carbide etch stop layers.

Because of the recent use of these low-k dielectric materials, the etching of the vias must be performed with great care. Accordingly, the etch stop layer may be etched all the way down to the underlying copper layer before the etch process is finished. This may result in some of the copper diffusing into the low-k dielectric layer leading to shorts in the interconnect layers, which may be devastating to the microprocessor.

SUMMARY OF THE INVENTION

According to one embodiment of the invention, a method for via etching in a dielectric material includes providing a wafer having a substrate, an etch stop layer disposed outwardly from the substrate, an Organo-Silica-Glass layer disposed outwardly from the etch stop layer, and a photoresist layer disposed outwardly from the Organo-Silica-Glass layer, and positioning the wafer within a process chamber. The method further includes introducing a first source gas mixture into the process chamber to etch a first portion of the Organo-Silica-Glass layer utilizing the first source gas mixture, and introducing a second source gas mixture into the process chamber to etch, for a predetermined time period, a second portion of the Organo-Silica-Glass layer down to the etch stop layer. The second source gas mixture includes a fluorocarbon, a noble gas, carbon monoxide, and nitrogen.

Embodiments of the invention provide a number of technical advantages. Embodiments of the invention may include all, some, or none of these advantages. By using certain combinations of reactive gases in a plasma etching process, a very high selectivity over the etch stop layer may be obtained, while still maintaining a high etch rate and proper via profile formation. This high selectivity guarantees a higher clearing of all vias, as well as substantially reducing the risk of copper diffusion into an OSG layer. Thinner etch stop layers may also be obtained, which helps to reduce line resistance and line capacitance, thereby decreasing the RC time delay of interconnects.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Figure 1:
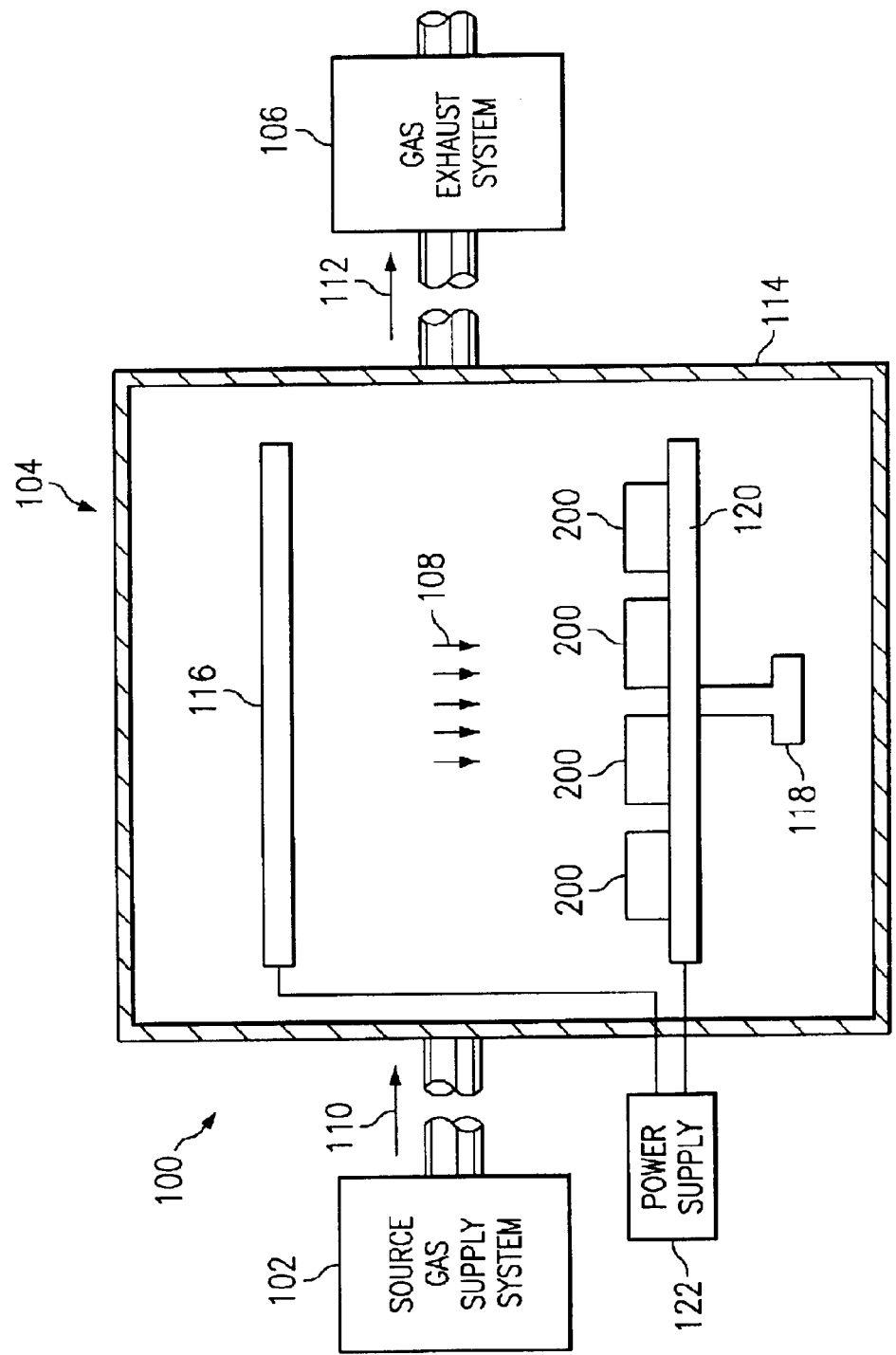
FIG. 1 is a schematic diagram of a plasma etching system used to etch one or more wafers in accordance with one embodiment of the present invention.
Figure 2A:
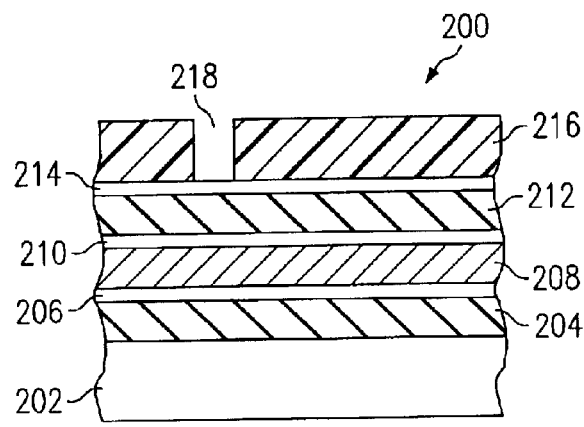
FIGS. 2A through 2D are partial elevation views of a wafer illustrating a method for via etching in an Organo-Silica-Glass layer according to one embodiment of the present invention.
Figure 2B:
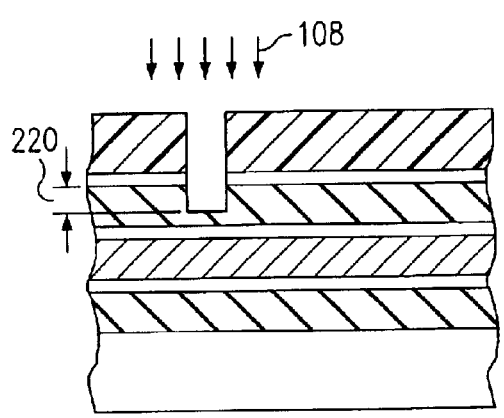
Figure 2C:
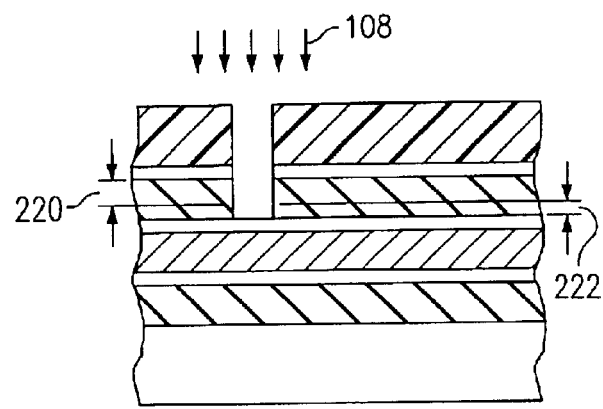
Figure 2D:
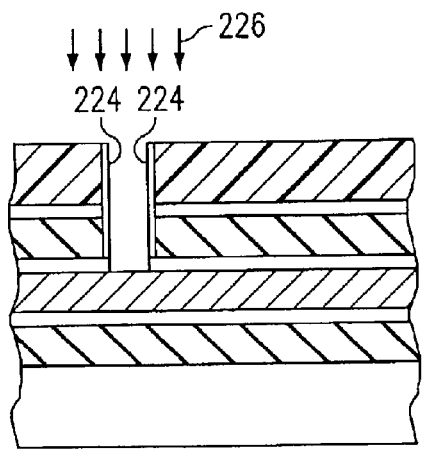
Figure 3:
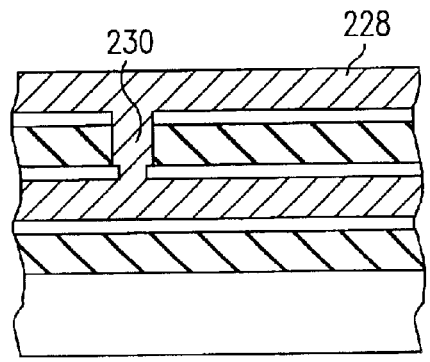
FIG. 3 is a partial elevation view of the wafer of FIGS. 2A through 2D illustrating two copper layers interconnected with a copper plug.

Example embodiments of the present invention and their advantages are best understood by referring now to FIGS. 1 through 3 of the drawings, in which like numerals refer to like parts.

FIG. 1 is a schematic diagram of a plasma etching system 100 used to etch one or more wafers 200 in accordance with one embodiment of the present invention. Plasma etching system 100 may include a source gas supply system 102, a reactor system 104, and a gas exhaust system 106. Generally, source gas supply system 102 operates to supply a source gas mixture 110 to reactor system 104, reactor system 104 utilizes source gas mixture 110 to form a reactive plasma 108 that is used to etch wafer 200, and gas exhaust system 106 removes an exhaust gas 112. The chemistry of source gas mixture 110 may be varied to selectively etch the various materials comprising wafer 200. The composition of exhaust gas 112 is indicative of the materials being etched or indicative of when source gas mixture 110 has reached steady state condition. A control system (not explicitly shown) may control the operation of each component in plasma etching system 100 to etch wafer 200 in a desired manner. Plasma etching system 100 may comprise other suitable components and systems without departing from the scope of the present invention.

Source gas supply system 102 includes individual source gases, such as oxygen, nitrogen, fluorocarbon, carbon monoxide, argon, xenon, and other suitable gases. A source gas controller in source gas supply system 102 receives the individual source gases and mixes the gases to form source gas mixture 110 that is supplied to reactor system 104. Source gas mixture 110 has an associated chemistry that is determined by the individual source gases and their quantity used in source gas mixture 110. As discussed in greater detail below, the chemistry of source gas mixture 110 determines the selectivity of reactive plasma 108 to various materials. Source gas supply system 102 may comprise other suitable devices and systems without departing from the scope of the present invention.

Reactor system 104 includes a plasma chamber 114 that includes an upper electrode 116, a rotatable base 118, and a lower electrode 120 coupled to base 118. A power supply system 122 is coupled to upper electrode 116 and lower electrode 120. Wafer 200, to be etched, may be generally rotated by base 118 during the etching process. Electrodes 116 and 120, when turned on, operate to ionize source gas mixture 110 flowing through plasma chamber 114 and ignite source gas mixture 110 to form reactive plasma 108. Reactor system 104 may comprise other suitable devices or systems without departing from the scope of the present invention.

Gas exhaust system 106 may comprise such devices as an endpoint detector and a pumping system. The pumping system operates to maintain the pressure within plasma chamber 114 at acceptable vacuum pressures. The endpoint detector operates to determine the composition of exhaust gas 112. The endpoint detector may sense which materials within wafer 200 are being consumed during the etching process. Gas exhaust system 106 may comprise other suitable devices or systems without departing from the scope of the present invention.

In the general operation of plasma etching system 100, wafer 200 is positioned in plasma chamber 114. Plasma chamber 114 is then vacuum sealed and plasma etching system 100 is engaged. A control system turns on a pumping system in gas exhaust system 106 and source gas supply system 102. Source gas mixture 110 may initially flow only a purge gas for a specified time to purge plasma chamber 114. After purging plasma chamber 114, source gas mixture 110 is then varied to a predetermined etching chemistry. When the proper etching chemistry has stabilized, power supply system 122 is turned on. Power supply system 122 provides RF power to electrodes 116 and 120 such that source gas mixture 110 is ionized and ignited to form reactive plasma 108. Reactive plasma 108 is directed at wafer 200. Reactive plasma 108 anisotropically etches the exposed surfaces of wafer 200. When reactive plasma 108 has etched through the applicable materials and starts etching through another material an endpoint detector in gas exhaust system 106 senses the change in material being etched. Depending upon the etching processes to be performed, a control system could turn off power supply system 122 in response to the change in material being etched, or the control system may vary the chemistry of source gas mixture 110 and thereby vary the composition of reactive plasma 108 to anisotropically etch through a new material.

According to the teachings of the present invention, source gas mixture 110 includes one or more predetermined chemistries for etching vias in Organo-Silica-Glass ("OSG"), such that a high selectivity is obtained while maintaining other important etching criteria, such as etch rate and uniformity. One method for via etching in a dielectric material is illustrated in FIGS. 2A through 2D.

FIGS. 2A through 2D are partial elevation views of wafer 200 illustrating a method for via etching in OSG according to one embodiment of the present invention. Wafer 200 may include a substrate 202, a dielectric layer 204, a buffer layer 206, a metal layer 208, an etch stop layer 210, and OSG layer 212, a buffer layer 214, and a photoresist layer 216. Wafer 200 may have less layers, more layers, or layers formed from different materials than described herein. Wafer 200 is only example of a semiconductor wafer having various layers.

Substrate 200 may be formed from any suitable material used in semiconductor chip fabrication, such as silicon or germanium. Although not illustrated in FIG. 2A, substrate 202 has any of various microelectronic devices formed therein, such as transistors, diodes, resistors, and capacitors. Substrate 200 may be formed with any suitable thickness.

Dielectric layer 204 comprises any suitable type of dielectric, such as oxide or nitride, and is formed using any suitable growth and/or deposition technique used in semiconductor processing. Dielectric layer 204 is an optional layer, and in one embodiment, dielectric layer 204 electrically insulates the microelectronic devices formed in substrate 202 from metal layer 208. Dielectric layer 204 may also be used in forming a gate stack outwardly from substrate 202. Dielectric layer 204 may be formed with any suitable thickness.

Buffer layer 206 comprises any suitable type of dielectric, such as silicon nitride or silicon carbide, and is formed using any suitable growth and/or deposition technique used in semiconductor processing. Buffer layer 206, in one embodiment, is used as an etch stop for the etching of metal layer 208. Buffer layer 206 may be formed with any suitable thickness, but is typically between 300 and 1000 angstroms.

Metal layer 208 is formed from any suitable conductive material, such as copper or aluminum, and is formed using any suitable growth and/or deposition technique used in semiconductor processing. Metal layer 208 operates, in whole or in part, as a conductive path from one or more microelectronic devices formed in substrate 202 to other microelectronic devices formed in substrate 202. In one embodiment, metal layer 208 is formed with a thickness of approximately 5000 angstroms; however, other suitable thicknesses may be used.

Etch stop layer 210 is formed from any suitable type of dielectric, such as silicon carbide or silicon nitride, and is formed using any suitable growth and/or deposition technique using semiconductor processing. As discussed in greater detail below, etch stop layer 210 is used in the etching of OSG layer 212 to prevent over-etching, such that any metal from metal layer 208 will not diffuse into OSG layer 212 when etching a via. Etch stop layer 210 is typically formed with a thickness of approximately 300 angstroms to 1000 angstroms; however, other suitable thicknesses may be used. In one particular embodiment, etch stop layer 210 is formed with a thickness of no more than approximately 500 angstroms.

OSG layer 212, in one embodiment, is formed from Organo-Silica-Glass ("OSG"); however, other suitable organic dielectric materials may be used for OSG layer 212. Typically, the type of dielectric material used for OSG layer 212 is a high-resistance low-K dielectric material. OSG layer 212 is preferably made of a low-K dielectric material because semiconductor manufacturers desire to reduce line resistance and line capacitance to speed up, for example, processor speed of a microprocessor. In one embodiment, OSG layer 212 is formed with a thickness of approximately 8000 angstroms to 12000 angstroms; however, other suitable thicknesses may be used.

Buffer layer 214 is similar to buffer layer 206 and that is formed from any suitable dielectric material, such as silicon carbide or silicon nitride, and is formed using any suitable growth and/or deposition technique used in semiconductor processing. Again, buffer layer 214 is used as an etch stop layer for the etching of a metal layer that is disposed outwardly from buffer layer 214 (not shown). Buffer layer 214 is typically formed with a thickness of approximately 300 angstroms to 1000 angstroms; however, other suitable thicknesses may be used.

Photoresist layer 216 is formed by conventional photolithography techniques. Any suitable photoresist material may be used to form photoresist layer 216. Photoresist layer 216 includes one or more windows 218, which is formed using any suitable photolithographic techniques known in the art of semiconductor processing. Window 218 is where a via is to be formed in wafer 200, as discussed more fully below.

Formation of a via in wafer 200 is described in detail below in conjunction with FIGS. 2B through 2D with additional reference to FIG. 1. Although not illustrated in FIGS. 2B through 2D, the below description refers to steps that occur when wafer 200 is positioned in plasma chamber 114 (FIG. 1). However, the etching processes may take place in different processing chambers using one or more various etching techniques.

FIG. 2B illustrates an etching of a portion of buffer layer 214 and a first portion 220 of OSG layer 212. This etching process may be performed using any suitable etching process; however, in one embodiment, a low-selectivity, low-polymerizing, main etch is performed using reactive plasma 108 formed from an ionized gas mixture 110 that includes a fluorocarbon and nitrogen. Preferably, a majority of OSG layer 212 is etched away using this relatively fast etching process. For example, if OSG layer 212 is approximately 8000 angstroms thick, then the etching depth of first portion 220 is approximately 7000 angstroms. However, OSG layer 212 may be etched down to any suitable depths using any suitable etching techniques.

FIG. 2C illustrates the etching of a second portion 222 of OSG layer 212 down to etch stop layer 210 utilizing reactive plasma 108 that is formed from an ionized source gas mixture 110 that is different from the ionized source gas mixture 110 that is used for the main etch as described above in FIG. 2B. The reason source gas mixture 110 is different for the two processes shown in FIGS. 2B and 2C is because the etching of the via is getting closer to the surface of metal layer 208. Any over-etching should be avoided at this point in the via etching because diffusion of metal from metal layer 208 into OSG layer 212 may be devastating to one or more microelectronic devices fabricated in wafer 200. The etching of second portion 222 is performed for a predetermined time period, such as 30 to 90 seconds. However, other suitable time periods may be utilized.

Source gas mixture 110 used to form reactive plasma 108, in one embodiment, comprises a fluorocarbon, a noble gas, carbon monoxide, and nitrogen. In other embodiments, oxygen is also added to source gas mixture 110. Preferably, a volumetric flow rate of the fluorocarbon, the noble gas, the carbon monoxide, and the nitrogen is such that a selectivity of the material in OSG layer 212 to the material in etch stop layer 210 is no less than approximately 15:1. As examples, a volumetric flow rate of the fluorocarbon may be between 2 and 20 sccm, a volumetric flow rate of a noble gas is between 100 and 400 sccm, a volumetric flow rate of the carbon monoxide is between 50 and 200 sccm, a volumetric flow rate of nitrogen is between 90 and 250 sccm, and a volumetric flow rate of the oxygen, if present, is less than approximately 10 sccm. In one embodiment where oxygen is a part of source gas mixture 110, a carbon monoxide:oxygen volumetric flow rate ratio is approximately 20:1.

Because OSG contains a $CH_3$ organic group, an increase in polymerization is obtained, which increases the amount of polymer formed through the etch process. This may result in etch stop if no nitrogen is used. Therefore, a relatively high volumetric flow rate of nitrogen is required to attack the $CH_3$ organic group of OSG so that etch stop may be prevented.

As described above, in one embodiment, a sufficient volumetric flow rate of nitrogen is between 90 and 250 sccm. A more advantageous volumetric flow rate of nitrogen is between 95 and 180 sccm, and a particular volumetric flow rate of nitrogen that has shown to give excellent results in attacking the $CH_3$ organic group of OSG is between 100 and 110 sccm. In another particular embodiment, a volumetric flow rate of nitrogen is sufficient to remove an ethyl group of the OSG at a rate that is at least as fast as the rate of removal of the silica group of the OSG.

Depending upon the materials being etched and the process and quality parameters, the gases that make up source gas mixture 110 for etching second portion 222 are adjusted to obtain the desired results. An important result is that all vias are cleared while avoiding any over-etching into the metal of metal layer 208 to avoid any diffusion of the metal into OSG layer 212; this is why high selectivity is desired. The achievement of high selectivity allows etch stop layer 210 to be thinner, which improves the device or devices fabricated in wafer 200 by reducing the RC time delay of the interconnects. To complete the formation of the via, etch stop layer 210 must be removed. This is illustrated in FIG. 2D.

FIG. 2D illustrates the removal of a portion of etch stop layer 210 to complete via formation. Any suitable well known etching techniques may be used to remove the portion of etch stop layer 210. One such well known technique is referred to as an e-stop etch, in which sidewalls 224 are formed using a suitable passivation technique before the portion of etch stop layer 210 is removed with, for example, an argon bombardment 226. After removing the portion of etch stop layer 210, wafer 200 is cleaned using any suitable cleaning techniques well known in the art of semiconductor processing. Thereafter, metal layer 208 may be interconnected with a second metal layer 228 and a plug 230 as illustrated in FIG. 3.

FIG. 3 illustrates the interconnection of metal layer 208 with second metal layer 228 using plug 230. Second metal layer 228 and plug 230 are preferably formed from the same material as metal layer 210 and is formed using any suitable growth and/or deposition techniques used in semiconductor processing. Although not illustrated, further processing may be performed on wafer 200 outwardly from second metal layer 228, such as the addition of other metal layers so that other microelectronic devices formed in substrate may be interconnected.

Although embodiments of the invention and their advantages are described in detail, a person skilled in the art could make various alterations, additions, and omissions without departing from the spirit and scope of the present invention as defined by the appended claims.

What is claimed is:

1. A method for via etching in a dielectric material, comprising:

provding a wafer having a substrate, a silicon carbide layer having a thickness of no more than approximately 500 angstroms disposed outwardly from the substrate, an Organo-Silica-Glass layer disposed outwardly from the silicon carbide layer, and a photoresist layer disposed outwardly from the Organo-Silica-Glass layer;

positioning the wafer within a process chamber;

introducing a first source gas mixture into the process chamber;

etching a first portion of the Organo-Silica-Glass layer utilizing the first source gas mixture;

introducing a second source gas mixture into the process chamber, the second source gas mixture comprising a fluorocarbon, argon, carbon monoxide, nitrogen, and oxygen;

etching, for a time period between approximately thirty and ninety seconds, a second portion of the Organo-Silica-Glass layer down to the silicon carbide layer utilizing the second source gas mixture, the second source gas mixture having a volumetric flow rate of the fluorocarbon of between 2 and 20 sccm, a volumetric flow rate of the argon of between 100 and 400 sccm, a volumetric flow rate of the carbon monoxide of between 50 and 200 sccm, and a volumetric flow rate of the oxygen is less than 10 sccm, and a volumetric flow rate of the nitrogen that is sufficient to remove an ethyl group of the Organo-Silica-Glass at a rate that is at least as fast as the rate of removal of a silica group of the Organo-Silica-Glass;

etching the silicon carbide layer; and cleaning the wafer.

2. The method of claim 1, wherein the carbon monoxide:oxygen volumetric flow rate ratio is approximately 20:1.

3. The method of claim 1, wherein the volumetric flow rate of the nitrogen is between 90 and 250 sccm.

4. The method of claim 1, wherein the volumetric flow rate of the nitrogen is between 95 to 180 sccm.

5. The method of claim 1, wherein the volumetric flow rate of the nitrogen is between 100 to 110 sccm.

6. A method for via etching in a dielectric material, comprising:

providing a wafer having a substrate, an etch stop layer disposed outwardly from the substrate, an Organo-Silica-Glass layer disposed outwardly from the etch stop layer, and a photoresist layer disposed outwardly from the Organo-Silica-Glass layer;

positioning the wafer within a process chamber;

introducing a first source gas mixture into the process chamber;

etching a first portion of the Organo-Silica-Glass layer utilizing the first source gas mixture;

introducing a second source gas mixture into the process chamber, the second source gas mixture comprising a fluorocarbon, a noble gas, carbon monoxide, nitrogen, and oxygen, a volumetric flow rate of the nitrogen being between 90 and 250 sccm for attacking an ethyl group of the Organo-Silica-Glass;

etching, for a predetermined time period, a second portion of the Organo-Silica-Glass layer down to the etch stop layer utilizing the second source gas mixture, wherein a volumetric flow rate of the fluorocarbon, the noble gas, the carbon monoxide, the nitrogen, and the oxygen is such that a selectivity of the Organo-Silica-Glass to Silicon Carbide is no less than approximately 15-to-1;

removing the etch stop layer; and cleaning the wafer.

7. The method of claim 6, wherein providing the wafer comprises providing a wafer having an etch stop layer formed from a material selected from the group consisting of silicon carbide and silicon nitride, the etch stop layer being formed with a thickness of no more than approximately 500 angstroms.

8. The method of claim 6, wherein a volumetric flow rate of the fluorocarbon is between 2 and 20 sccm, a volumetric flow rate of the noble gas is between 100 and 400 sccm, a volumetric flow rate of the carbon monoxide is between 50 and 200 sccm, and a volumetric flow rate of the oxygen is less than 10 sccm.

9. The method of claim 6, wherein the carbon monoxide:oxygen volumetric flow rate ratio is approximately 20:1.

10. The method of claim 6, wherein etching, for the predetermined time period, the second portion of the Organo-Silica-Glass layer down to the etch stop layer utilizing the second source gas mixture comprises etching for a time period between 30 and 90 seconds.

11. The method of claim 6, wherein the volumetric flow rate of the nitrogen is between 100 to 110 sccm.

12. A method for via etching in a dielectric material, comprising:

providing a wafer having a substrate, an etch stop layer disposed outwardly from the substrate, an Organo-Silica-Glass layer disposed outwardly from the etch stop layer, and a photoresist layer disposed outwardly from the Organo-Silica-Glass layer;

positioning the wafer within a process chamber;

introducing a first source gas mixture into the process chamber;

etching a first portion of the Organo-Silica-Glass layer utilizing the first source gas mixture;

introducing a second source gas mixture into the process chamber, the second source gas mixture comprising a fluorocarbon, a noble gas, carbon monoxide, and nitrogen; and etching, for a predetermined time period, a second portion of the Organo-Silica-Glass layer down to the etch stop layer utilizing the second source gas mixture.

13. The method of claim 12, wherein providing the wafer comprises providing a wafer having an etch stop layer formed from a material selected from the group consisting of silicon carbide and silicon nitride, the etch stop layer being formed with a thickness of no more than approximately 500 angstroms.

14. The method of claim 13, wherein a volumetric flow rate of the fluorocarbon, the noble gas, the carbon monoxide, and the nitrogen is such that a selectivity of the Organo-Silica-Glass to the etch stop layer is no less than approximately 15-to-1.

15. The method of claim 12, wherein introducing the second source gas mixture into the process chamber comprises introducing a second source gas mixture into the process chamber, the second source gas mixture comprising a fluorocarbon, a noble gas, carbon monoxide, nitrogen, and oxygen.

16. The method of claim 12, wherein a volumetric flow rate of the fluorocarbon is between 2 and 20 sccm.

17. The method of claim 12, wherein a volumetric flow rate of the noble gas is between 100 and 400 sccm.

18. The method of claim 12, wherein a volumetric flow rate of the carbon monoxide is between 50 and 200 sccm.

19. The method of claim 15, wherein the volumetric flow rate of the nitrogen is between 90 and 250 sccm.

20. The method of claim 15, wherein a volumetric flow rate of the oxygen is less than 10 sccm.

* * * * *